(12) United States Patent
Hsu

(10) Patent No.: US 8,987,017 B2
(45) Date of Patent: Mar. 24, 2015

(54) LIGHT-EMITTING DEVICE

(71) Applicant: Epistar Corporation, Hsinchu (TW)

(72) Inventor: Chia-Liang Hsu, Hsinchu (TW)

(73) Assignee: Epistar Corporation, Hsinchu (TW)

( * ) Notice: Subject to any disclaimer, the term of this patent is extended or adjusted under 35 U.S.C. 154(b) by 0 days.

(21) Appl. No.: 14/265,102

(22) Filed: Apr. 29, 2014

(65) Prior Publication Data

US 2014/0234997 A1 Aug. 21, 2014

Related U.S. Application Data

(62) Division of application No. 12/831,647, filed on Jul. 7, 2010.

(30) Foreign Application Priority Data

Jul. 7, 2009 (TW) .............................. 98123043 A

(51) Int. Cl.
*H01L 21/00* (2006.01)
*H01L 27/15* (2006.01)
*H01L 25/16* (2006.01)
(Continued)

(52) U.S. Cl.
CPC ............ *H01L 27/153* (2013.01); *H01L 25/167* (2013.01); *H01L 25/0753* (2013.01); *H01L 33/64* (2013.01); *H01L 2224/48137* (2013.01); *H01L 2224/48227* (2013.01);
(Continued)

(58) Field of Classification Search
None
See application file for complete search history.

(56) References Cited

U.S. PATENT DOCUMENTS 6,759,678 B2 7/2004 Yamazaki et al.
7,732,829 B2 6/2010 Murphy
(Continued)

FOREIGN PATENT DOCUMENTS

CN 1728409 2/2006
CN 101071812 11/2007
(Continued)

OTHER PUBLICATIONS

Kyocera. Fine Ceramics (Advanced Ceramics): Alumina. Retrieved on Jan. 26, 2014 http://global.kyocera.com/prdct/fc/list/material/alumina/alumina.html.
(Continued)

*Primary Examiner* — Angel Roman
(74) *Attorney, Agent, or Firm* — Muncy, Geissler, Olds & Lowe, P.C.

(57) ABSTRACT

This disclosure discloses a method of manufacturing a light-emitting device, comprising proving a single growth substrate having a first major surface and a second major surface; forming a plurality of light-emitting stacks on the first major surface, wherein the light-emitting stacks are electrically connected to each other in series via a first electrical connecting structure; forming an electronic device on the second major surface; and forming a second electrical connecting structure extending from the first major surface to the second major surface and electrically connecting the first light-emitting stacks and the electronic device, wherein the electronic device comprises a resistance, an inductance, capacitance, or a rectifying device, and wherein the material of the resistance comprises tantalum nitride (TaN), silicon-chromium alloy (SiCr), or nickel-chromium alloy (NiCr).

20 Claims, 12 Drawing Sheets

(51) Int. Cl.
    *H01L 25/075* (2006.01)
    *H01L 33/64* (2010.01)
(52) U.S. Cl.
    CPC .............. *H01L 2224/49107* (2013.01); *H01L 2224/73265* (2013.01); *H01L 2924/30107* (2013.01)
    USPC ............. 438/23; 438/24; 438/25; 438/26; 257/E21.001

(56) References Cited

U.S. PATENT DOCUMENTS

| | | | |
|---|---|---|---|
| 7,768,026 B2 * | 8/2010 | Cheng | 257/98 |
| 7,947,993 B2 | 5/2011 | Kim et al. | |
| 8,193,015 B2 | 6/2012 | Horng et al. | |
| 8,193,546 B2 | 6/2012 | Horng et al. | |
| 2003/0025657 A1 * | 2/2003 | Iwafuchi | 345/82 |
| 2004/0208210 A1 * | 10/2004 | Inoguchi | 372/36 |
| 2008/0191632 A1 | 8/2008 | Lee | |
| 2009/0194777 A1 | 8/2009 | Murphy | |
| 2009/0267085 A1 | 10/2009 | Lee et al. | |
| 2010/0001305 A1 | 1/2010 | Lin et al. | |
| 2010/0039044 A1 | 2/2010 | Hatakenaka et al. | |
| 2010/0051972 A1 | 3/2010 | Chen et al. | |
| 2010/0051977 A1 | 3/2010 | Kim et al. | |
| 2011/0316034 A1 | 12/2011 | Doan et al. | |

FOREIGN PATENT DOCUMENTS

| | | |
|---|---|---|
| TW | 200731863 | 8/2007 |
| TW | M328691 | 3/2008 |
| TW | I298553 | 7/2008 |
| WO | WO 2006/095949 A1 | 9/2006 |
| WO | WO 2008/075797 A1 | 6/2008 |
| WO | WO 2008/105245 A1 | 9/2008 |

OTHER PUBLICATIONS

Kyocera. Fine Ceramics (Advanced Ceramics): About Sapphire. Retrieved on Jan. 26, 2014 http://global.kyocera.com/prdct/fc/list/material/sapphire/index.html.

* cited by examiner

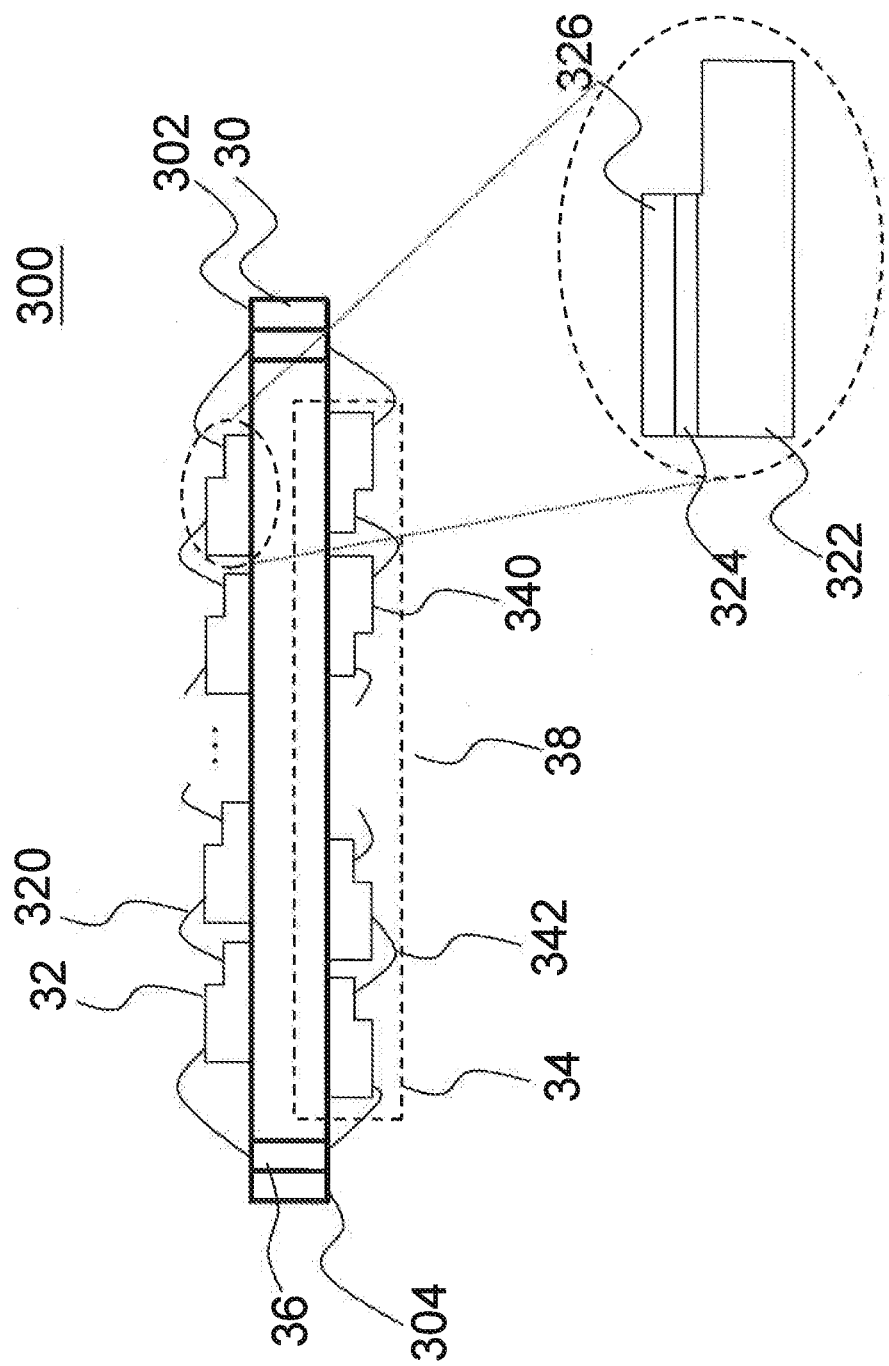

LIGHT-EMITTING DEVICE

CROSS REFERENCE TO RELATED APPLICATIONS

This application is a Divisional Application of co-pending Application No. 13/831,647, filed on 7 Jul. 2010, for which priority is claimed under 35 U.S.C. §120; and this application claims priority of Application No. 098123043 filed in Taiwan on 7 Jul. 2009 under 35 U.S.C. §119; the entire contents of all of which are hereby incorporated by reference.

TECHNICAL FIELD

The application relates to a light-emitting device, and more particularly to a light-emitting device comprising a substrate having a first major surface and a second major surface. A plurality of light-emitting stacks are on the first major surface, and at least one electronic device is on the second major surface, wherein the light-emitting stacks are electrically connected to the electronic device.

REFERENCE TO RELATED APPLICATION

The application claims the right of priority based on TW application Ser. No. 098123043 filed on Jul. 7, 2009, which is incorporated herein by reference and assigned to the assignee herein.

DESCRIPTION OF BACKGROUND ART

The light-emitting mechanism of the light-emitting diode is to take advantage of the energy difference of electrons between the n-type semiconductor and the p-type semiconductor and then to release the energy in the form of light, which is different from the light-emitting mechanism of the incandescent lamp, which is by heating. Therefore, the light-emitting diode is called the cold light source. Besides, the light-emitting diode has the advantages such as long endurance, long lifetime, light weight, and low power consumption. Therefore, the present illumination market expects the light-emitting diode as a new generation illumination to substitute for the traditional light source and apply it to various fields such as traffic signal, backlight module, street light, and medical apparatus.

FIG. 1 is the illustration of a conventional AC light-emitting diode device. As shown in FIG. 1, the light-emitting device 100 comprises a substrate 10, a plurality of light-emitting units 12 disposing on the substrate 10 and are serially connected to form circuit A and circuit B that are anti-parallel connected to each other later, and two electrodes 14 and 16 disposing on the substrate 10 and electrically connecting to the plurality of the light-emitting units 12. When the alternative current flows into the light-emitting device 100 through the electrode 14, the current passes through circuit A and triggers the light-emitting unit 12 in the circuit A to emit light. Correspondingly, when the alternative current flows into the light-emitting device 100 through the electrode 16, the current passes through circuit B and triggers the light-emitting unit 12 in the circuit B to emit light.

Besides, the light-emitting device 100 could form a photoelectric apparatus by further connecting with other components. FIG. 2 is the illustration for the conventional photoelectric apparatus. As shown in FIG. 2, a photoelectric apparatus 200 comprises a sub-mount 20, which comprises at least one circuit 202; a solder 22 located on the sub-mount 20 to attach the light-emitting device 100 on the sub-mount 20 and to electrically connect the substrate 10 of the light-emitting device 100 with the circuit 202 on the sub-mount 20; and one electrically connecting structure 24 electrically connecting the electrode 16 of the light-emitting device 100 and the circuit 202 on the sub-mount 20. The sub-mount 20 comprises a lead frame or a large-size mounting substrate to facilitate the circuit arrangement and to raise the heat dissipating efficiency.

Nevertheless, although the design of the light-emitting device 100 could be applied to the alternative current directly, only parts of the light-emitting units 12 emitting light at the same time often causes the waste of the light-emitting area on the light-emitting device.

SUMMARY OF THE DISCLOSURE

The present disclosure provides a method of manufacturing a light-emitting device, comprising providing a single growth substrate having a first major surface and a second major surface; forming a plurality of first light-emitting stacks on the first major surface, wherein the first light-emitting stacks are electrically connected to each other via a first electrical connecting structure; forming an electronic device on the second major surface; and forming a second electrical connecting structure extending from the first major surface to the second major surface and electrically connecting the first light-emitting stacks and the electronic device, wherein the electronic device comprises a resistance, an inductance, capacitance, or a rectifying device, and wherein the material of the resistance comprises tantalum nitride (TaN), silicon-chromium alloy (SiCr), or nickel-chromium alloy (NiCr).

The present disclosure also provides a method of manufacturing a light-emitting device, comprising providing a single growth substrate having a first major surface and a second major surface; forming a plurality of first light-emitting stacks on the first major surface; wherein the first light-emitting stacks are electrically connected to each other via a first electrical connecting structure; forming an electronic device on the second major surface; forming a second electrical connecting structure extending from the first major surface to the second major surface and electrically connecting the first light-emitting stacks and the electronic device; and forming a heat dissipation layer on the second major surface of the single growth substrate, wherein the heat dissipation layer comprises a thermal conductivity larger than 50 W/mK.

The present disclosure further provides a method of manufacturing a light-emitting device, comprising providing a single growth substrate having a first major surface and a second major surface; forming a plurality of light-emitting stacks on the first major surface; and forming a bridge rectifying device and a passive device on the second major surface, wherein the light-emitting stacks, the bridge rectifying device, and the passive device are electrically connected to each other.

BRIEF DESCRIPTION OF THE DRAWINGS

FIG. 3A is the side view illustration in accordance with one embodiment in the present disclosure.

DETAILED DESCRIPTION OF PREFERRED EMBODIMENTS

The following shows the description of the embodiments of the present disclosure in accordance with the drawings.

Figure 1:
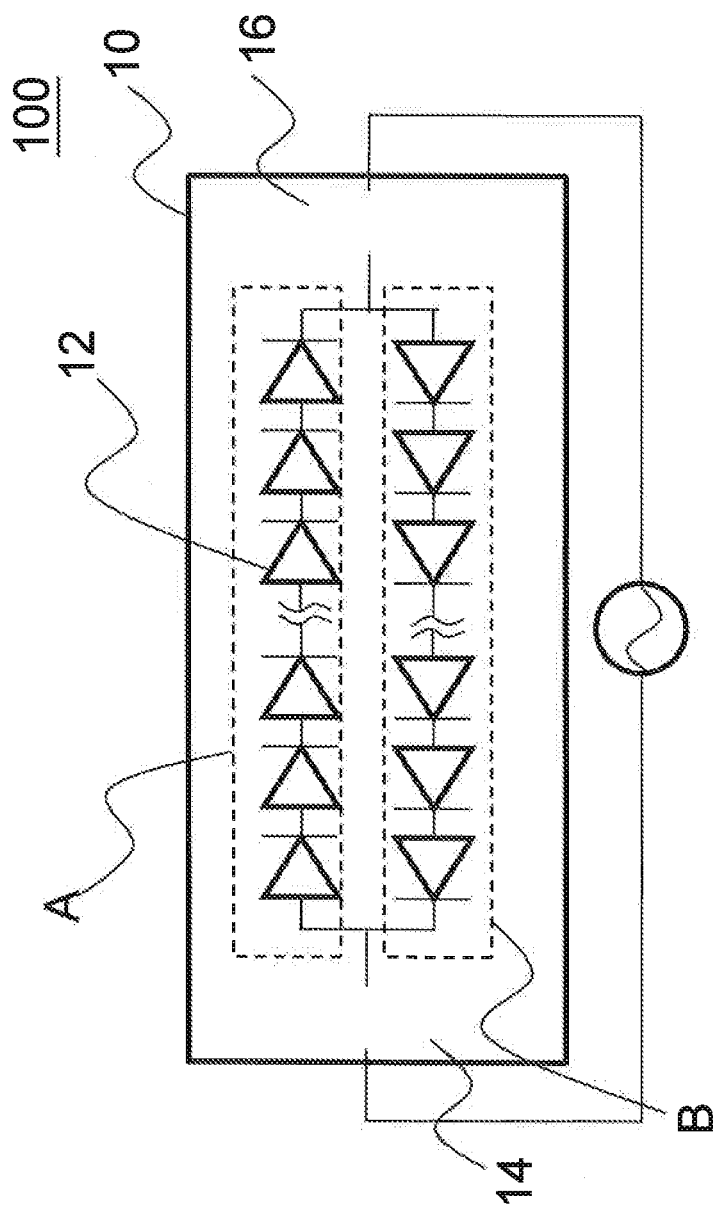
FIG. 1 is the illustration of the conventional light-emitting device.
Figure 2:
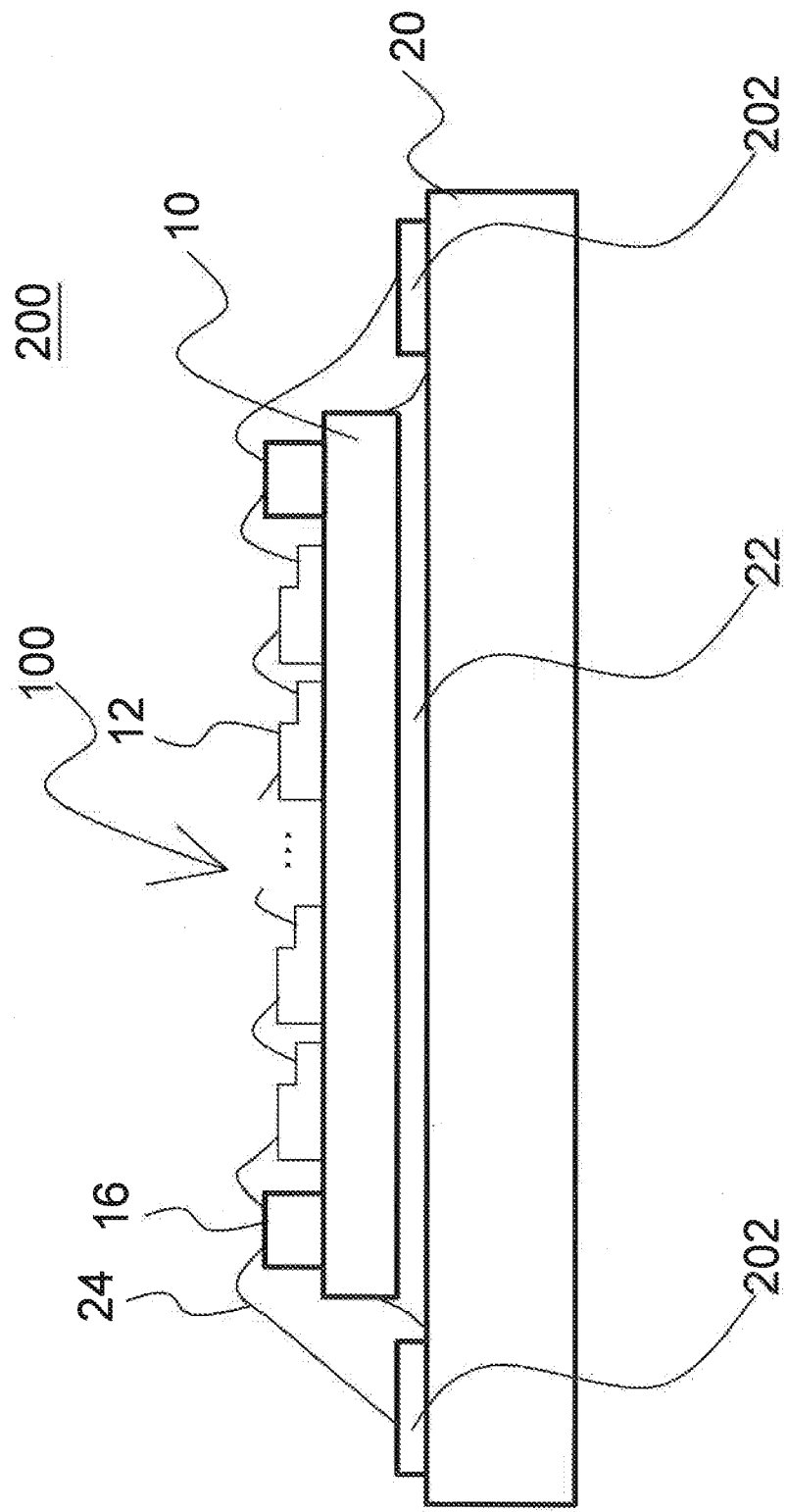
FIG. 2 is the illustration of the conventional photoelectric apparatus.
Figure 3B:
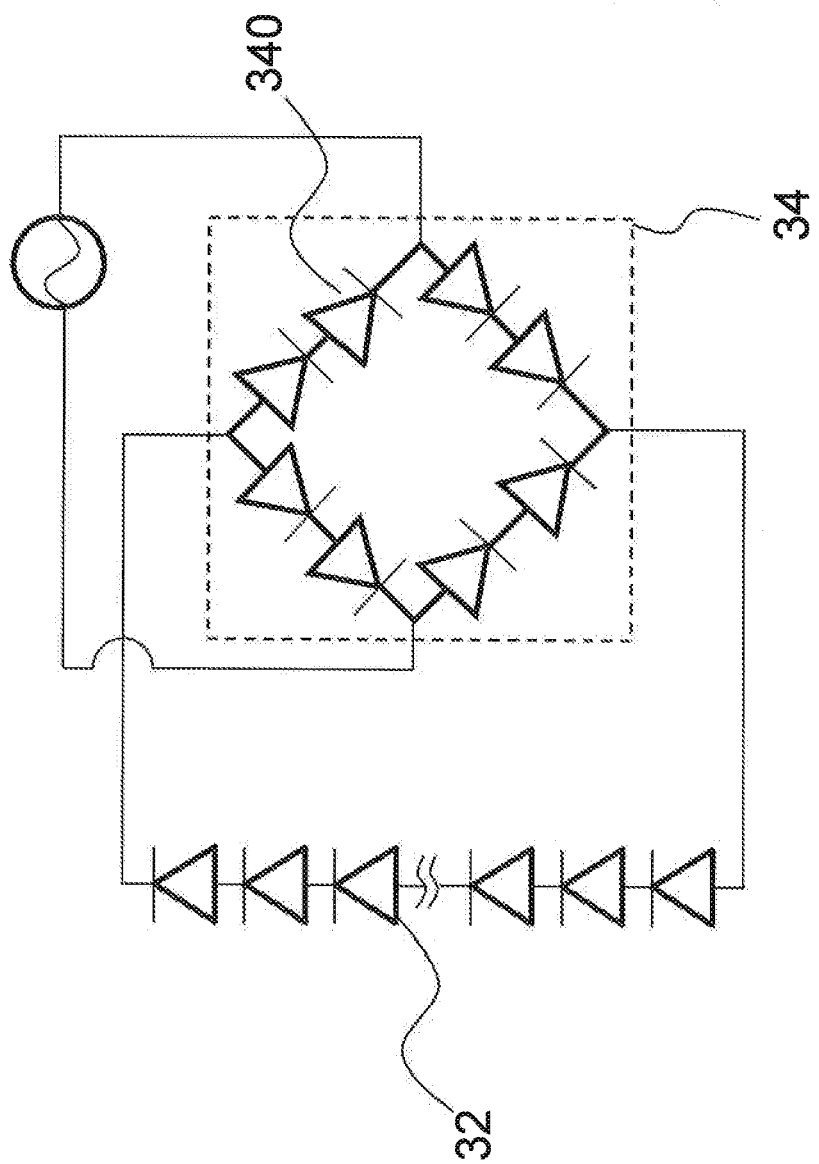
FIG. 3B is the circuit illustration of the present disclosure.

FIG. 3A is the side view illustration in accordance with one embodiment in the present disclosure and FIG. 3B is the circuit illustration in accordance with one embodiment of the present disclosure. As shown in FIGS. 3A and 3B, the light-emitting device comprises a substrate 30 having a first major surface 302 and a second major surface 304; a plurality of light-emitting stacks 32 spacing at intervals mutually on the first major surface 302, wherein the light-emitting stacks 32 electrically connecting to each other via a plurality of the first electrical connecting structures 320; and at least one rectifying device 34 locating on the second major surface 304 of the substrate 30, wherein the rectifying device 34 having a plurality of semiconductor stacks 340, which are electrically connecting to each other via a second electrical connecting structure 342 and arranging in a bridge circuit form. Besides, the light-emitting stacks 32 electrically connect to the rectifying device 34 by the first electrical connecting structure 36.

Besides, the light-emitting device 300 further comprises at least one bump pad 38, which is electrically connecting to the rectifying device 34 and the AC power supplier (not shown in the figure) respectively, located on the second major surface 304. When the alternative current flows into the light-emitting device 300 via the bump pad 38, the current is converted into a direct current by passing through the bridge rectifying circuit, which is arranged by the plurality of the semiconductor stacks 340 located on the second major surface 304, and then the current is transmitted to the light-emitting stacks 32 through the third electrical connecting structure 36, wherein the third electrical connecting structure 36 comprises the metal plug filled in the via hole passing through the substrate 30, or the conductive wire extending from the first major surface 302 to the second major surface 304.

In the light-emitting device 300, the materials of the substrate 30 comprise the insulating materials such as sapphire, aluminum nitride (MN), glass, or diamond. The substrate 30 can also be a single layer structure formed by a single material. The substrate 30 in the embodiment is a single layer substrate made of sapphire. The light-emitting stacks 32 comprise one first conducting type semiconductor layer 322 formed on the substrate 30, a light emitting layer 324 formed on the first conducting type semiconductor layer 322, and a second conducting type semiconductor layer 326 formed on the light emitting layer 324, wherein the materials of the light-emitting stacks 32 comprise semiconductor materials containing aluminum (Al), gallium (Ga), indium (In), nitrogen (N), phosphor (P), and/or arsenic (As), such as the Gallium Nitride (GaN) series materials or the Aluminum Gallium Indium Phosphide (AlGaInP) series materials. In the embodiment, the light-emitting stacks 32 are formed by the metal-organic chemical vapor deposition, and each light-emitting stack 32 comprises a partially exposed first conducting type semiconductor layer 322 formed by photolithography and the etching technology. The first electrical connecting structure 320 serially connects to the first conducting type semiconductor layer 322 of the light emitting stack 32 and the second conducting type semiconductor layer 326 of the adjacent light emitting stack 32 respectively.

Furthermore, the semiconductor stacks 340 for composing the rectifying device 34 comprise a plurality of the structures such as the light-emitting diode, the Zener diode, or the Schottky diode formed by the metal-organic chemical vapor deposition, the photolithography and the etching technology, and the materials comprise the III-V compounds or the Group IV elements such as the Gallium Nitride (GaN) series materials, the Aluminum Gallium Indium Phosphide (AlGaInP) series materials, or Silicon.

Figure 4A:
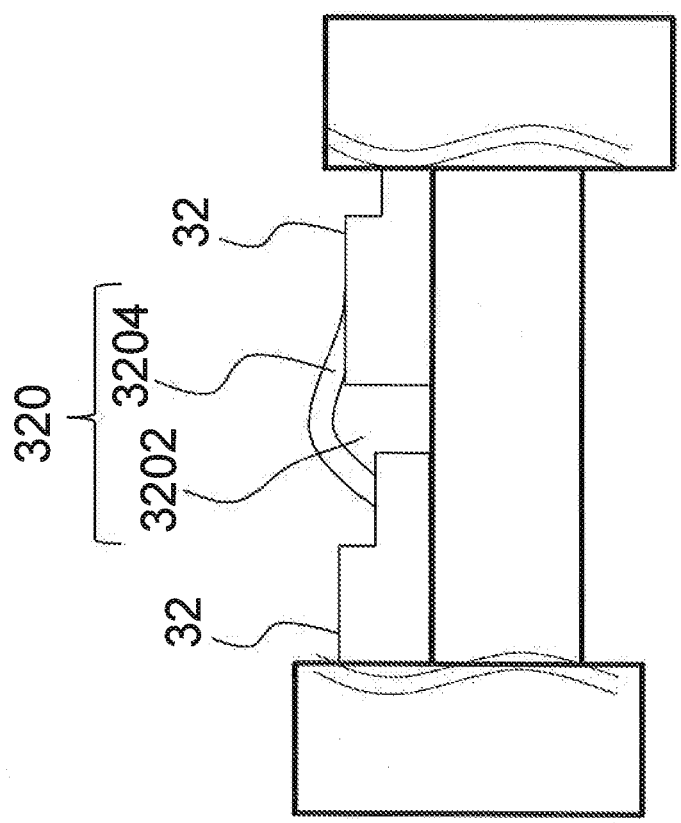
FIGS. 4A and 4B are the illustrations of the first electrical connecting structure in accordance with one embodiment in the present disclosure.
Figure 4B:
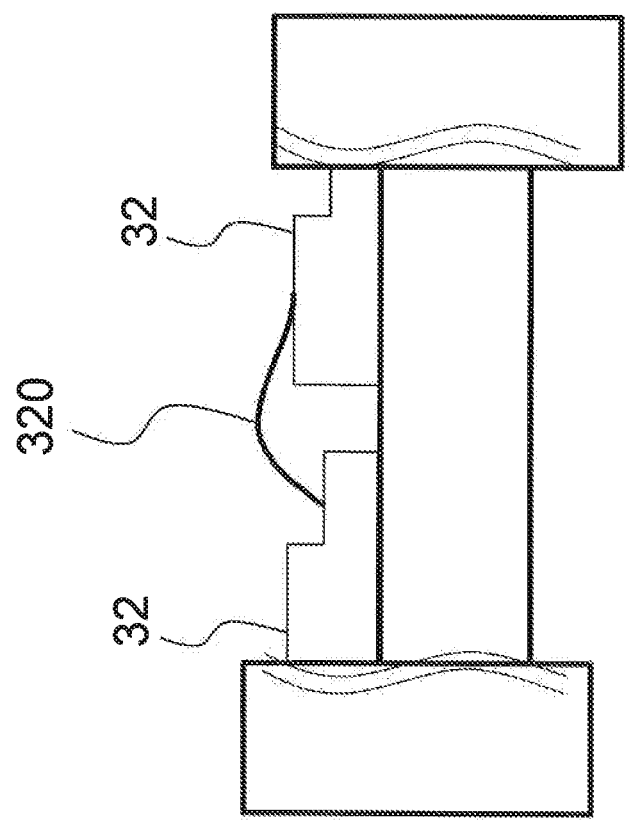
Figure 5A:
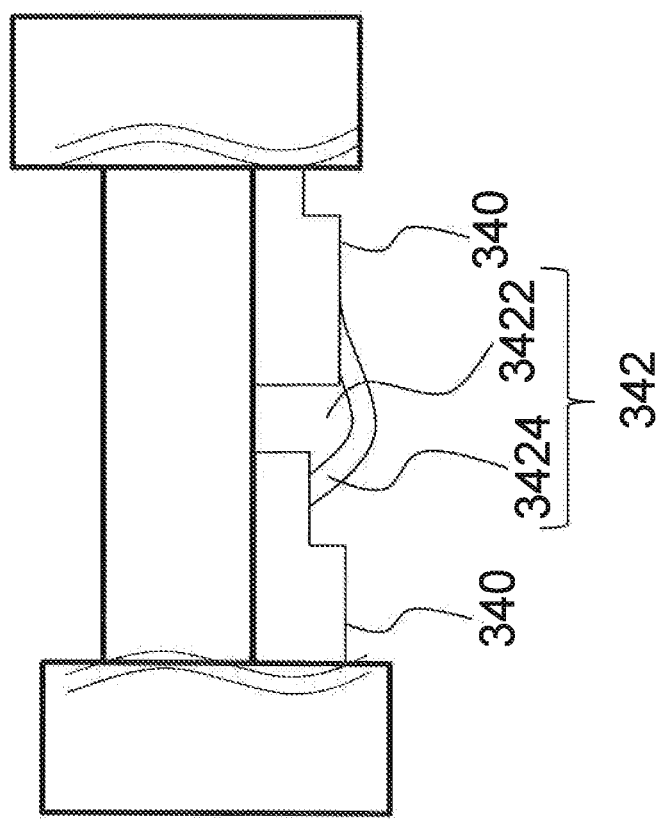
FIGS. 5A and 5B are the illustrations of the second electrical connecting structure in accordance with one embodiment in the present disclosure.
Figure 5B:
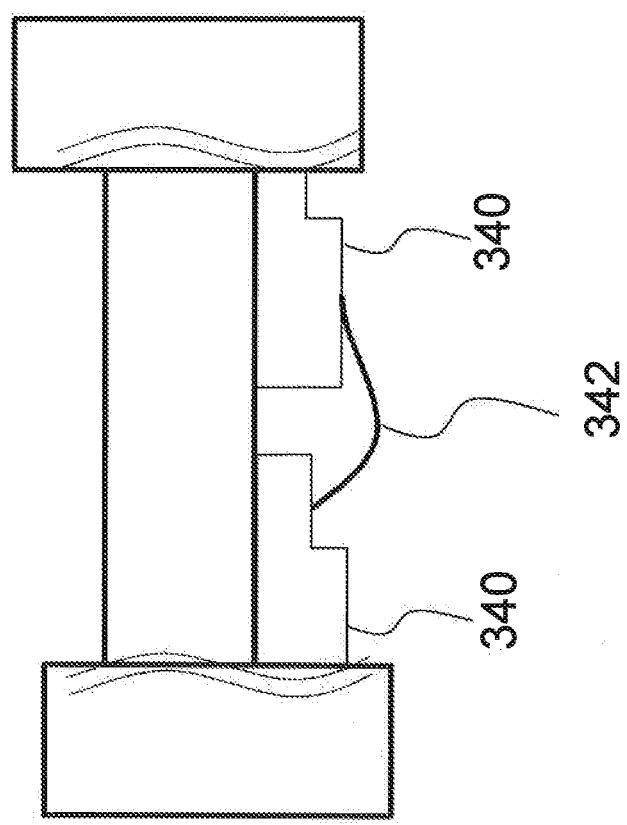

As shown in FIG. 4A, the first electrical connecting structure 320 comprises an insulating layer 3202 filled between the adjacent light-emitting stacks 32 to prevent the short circuit between the adjacent light-emitting stacks 32 and a metal layer 3204 that is located on the insulating layer 3202 and electrically connecting to the adjacent light-emitting stacks 32. Besides, the first electrical connecting structure 320 could also be a metal wire as shown in FIG. 4B, and the two terminals of the metal wire are connected to the adjacent light-emitting stacks 32 respectively. The second electrical connecting structure 342 comprises an insulating layer 3422 filled between the adjacent semiconductor stacks 340 to prevent the short circuit between the connecting semiconductor stacks 340 and a metal layer 3424 that is located on the insulating layer 3422 and electrically connecting to the adjacent semiconductor stacks 340. Besides, the second electrical connecting structure 342 can also be a metal wire as shown in FIG. 5B, and the two terminals of the metal wire are connected to the adjacent semiconductor stacks 340 respectively.

Figure 6:
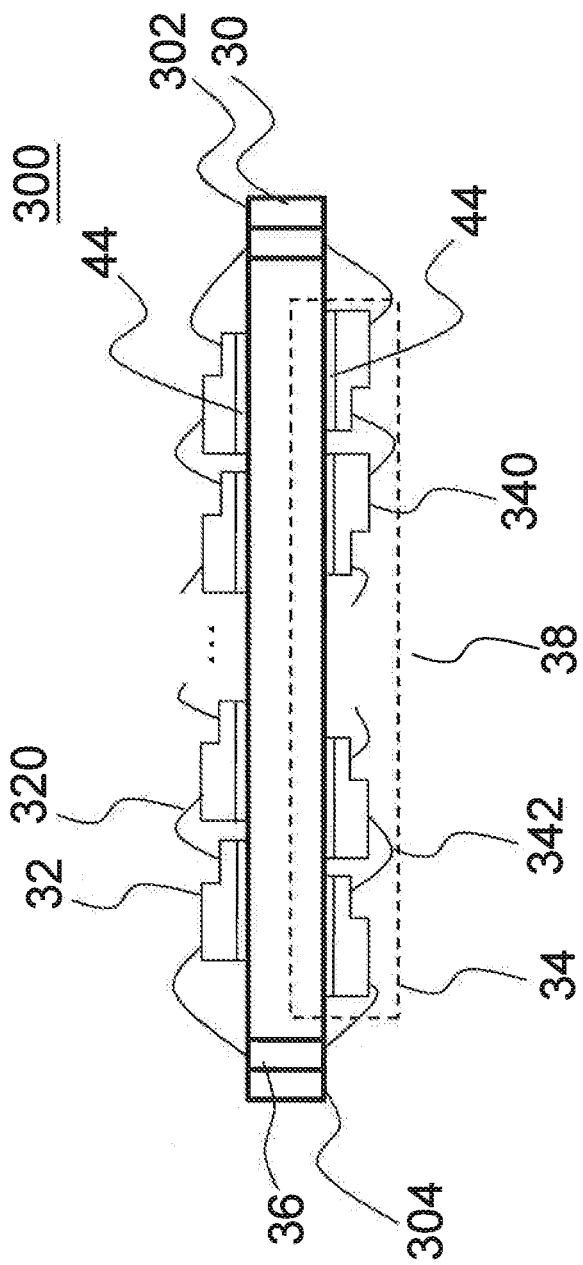
FIG. 6 is the top view and the bottom view in accordance with one embodiment in the present disclosure.

FIG. 6 is the illustration of another embodiment. The light-emitting stacks 32 and the semiconductor stacks 340 of the light-emitting device 300 can be formed on the first major surface 302 and the second major surface 304 by the metal-organic chemical vapor deposition, the photolithography and the etching technology. Besides, an adhesive layer 44 can also be provided between the light-emitting stacks 32, the semiconductor stacks 340 and the substrate 30 to attach the light-emitting stacks 32 and the semiconductor stacks 340 to the first major surface 302 and the second major surface 306 of the substrate 30 respectively. The yield of the products is therefore increased and the production cost is reduced. The material of the adhesive layer 44 comprises the metal material or the organic adhesive material.

Figure 7:
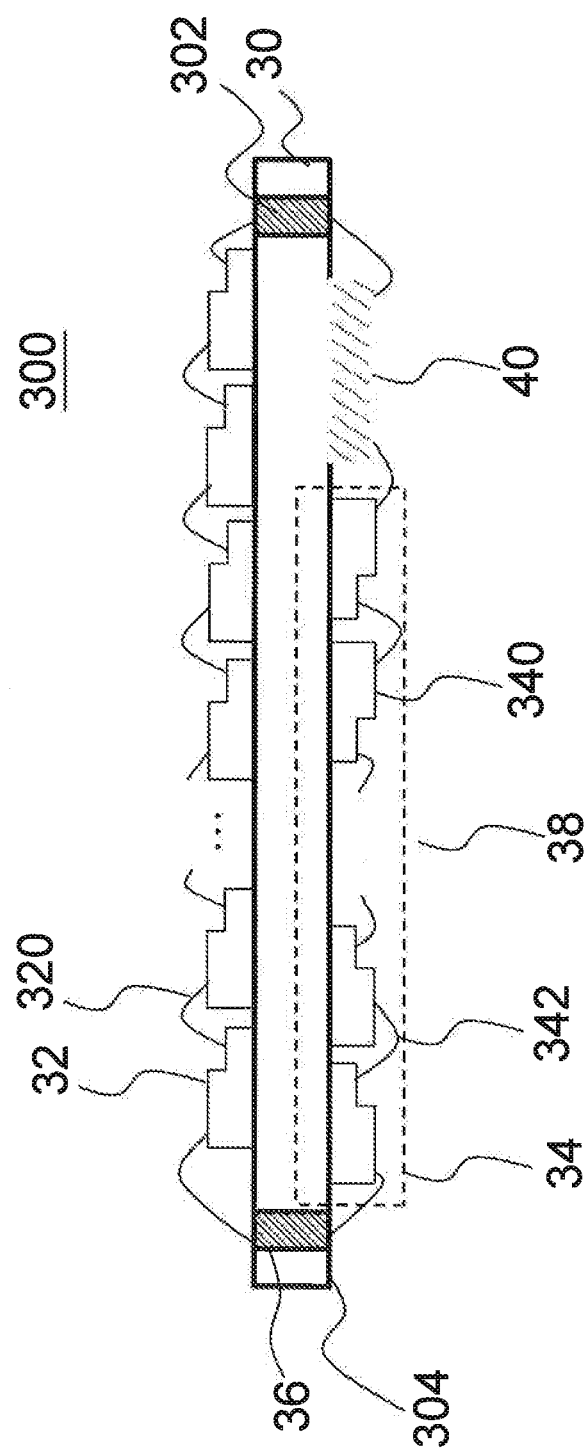
FIG. 7 is the illustration of the fourth electrical connecting structure in accordance with one embodiment in the present disclosure.

FIG. 7 is the illustration of another embodiment. As shown in FIG. 7, the light-emitting device 300 further comprises a passive device 40 located on the second surface 304 of the substrate 30 and electrically connecting to the rectifying device 34. For example, the passive device 40 comprises a resistance, an inductance, or a capacitance serially connecting to the rectifying device 34, or a capacitance parallelly connecting to the rectifying device 34 to provide the electric protection for the light-emitting device 300 or to adjust the electric characteristic of the light-emitting device 300. The passive device can be a thin-film resistance, a thin-film capacitance, or a thin-film inductance integrated with the light-emitting device 300 as a single chip, and the material of the above mentioned thin-film resistance comprises tantalum nitride (TaN), silicon-chromium alloy (SiCr), or nickel-chromium alloy (NiCr).

Figure 8:
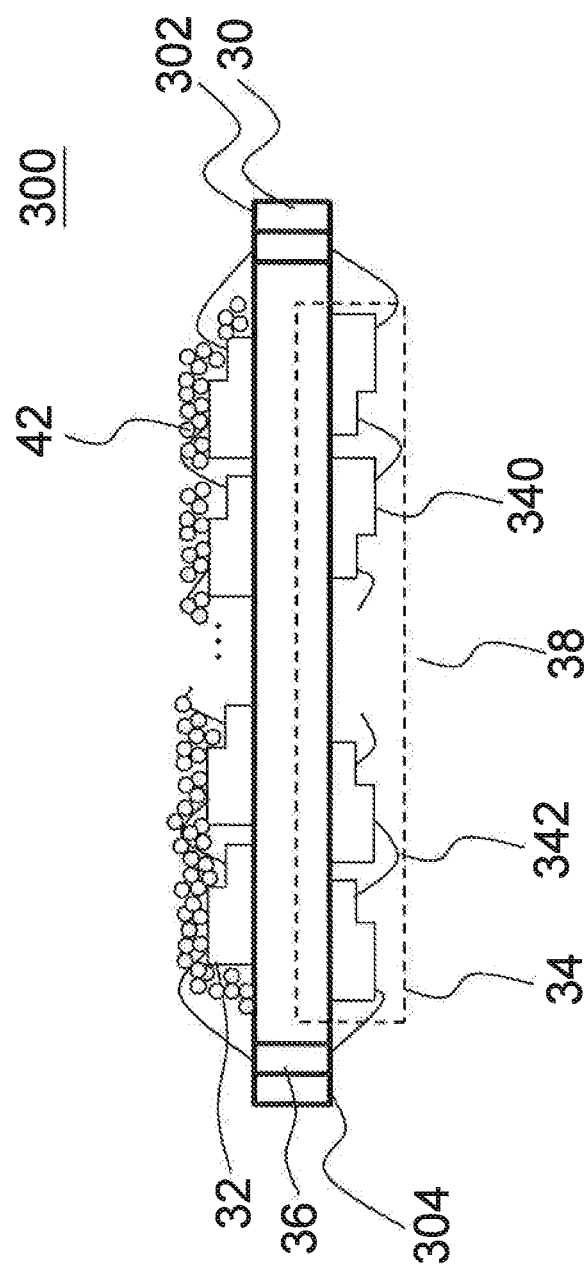
FIG. 8 is the illustration in accordance with another embodiment in the present disclosure.

FIG. 8 is the illustration of another embodiment. As shown in FIG. 8, the light-emitting device 300 further comprises a wavelength converting structure 42 located on the light-emitting stacks 32 to absorb and convert the light emitted from the light-emitting stacks 32. Wherein, the material of the wavelength comprises one or more than one fluorescent materials or phosphor materials, and the wavelength converting structure 42 can be a layer structure uniformly coated on the light-emitting stacks 32 or a glue comprising the fluorescent material to encapsulate the light-emitting stacks so the products with different optical properties are formed.

Figure 9:
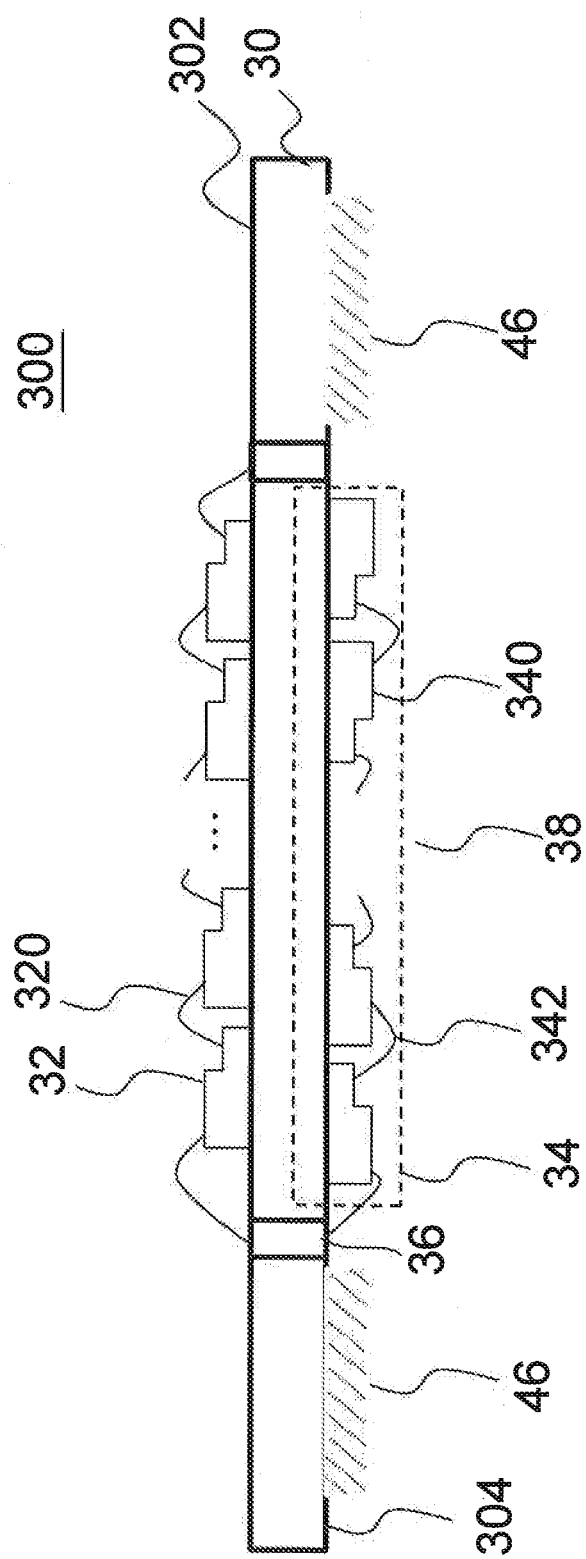
FIG. 9 is the illustration in accordance with another embodiment in the present disclosure.

FIG. 9 is the illustration of another embodiment. As shown in FIG. 9, the light-emitting device 300 further comprises a heat dissipation layer 46, wherein the heat dissipation layer 46 can connect with the second major surface 304 of the substrate 30 or the passive device 34 to guide the heat produced from the elements in the light-emitting device 300. Besides, the material of heat dissipation layer 46 has high thermal conductivity which is preferably larger than that of the substrate 30 or larger than 50 W/mK. The material of the heat dissipation layer 46 can be copper, silver, gold, nickel, diamond, diamond-like carbon (DLC), aluminum nitride (AlN), graphite, carbon nanotube (CNT), or the composite thereof. The thickness of the heat dissipation layer is preferably larger than 3 μm and the area of it is preferably not smaller than 30% of that of the substrate 30.

Furthermore, the light-emitting devices 300 as shown in FIG. 3A to FIG. 9 can be applied to the lighting system, and the lighting system can be further applied to the illumination system, the display backlight module, or the vehicle lighting, and the light-emitting devices 300 can be adapted to the power supply with 100V, 110V, 220V, 240V, 12V, 24V, or 48V.

The present disclosure discloses the light-emitting device 300 disposing the device such as the rectifying device 34, the bump pad 38, the resistance, the inductance, the capacitance, and the heat dissipation layer 46 that are not for light emitting on the second major surface 304 of the substrate 30 and to dispose the light-emitting stacks 32 on the first major surface 302 of the substrate 30. Such design uses the total surface where the light-emitting stacks 32 located on the light-emitting device 300 to be the light extraction surface and reduces the waste of light-emitting area.

The embodiments mentioned above are used to describe the technical thinking and the characteristic of the invention and to make the person with ordinary skill in the art to realize the content of the invention and to practice, which could not be used to limit the claim scope of the present invention. That is, any modification or variation according to the spirit of the present invention should also be covered in the claim scope of the present disclosure.

What is claimed is:

1. A method of fabricating a light-emitting device, comprising:
    providing a single growth substrate, comprising a first major surface and a second major surface;
    forming a plurality of first light-emitting stacks on the first major surface of the single growth substrate, wherein the first light-emitting stacks are electrically connected to each other via a first electrical connecting structure;
    forming an electronic device on the second major surface of the single growth substrate; and
    forming a second electrical connecting structure extending from the first major surface to the second major surface of the single growth substrate and electrically connecting the first light-emitting stacks and the electronic device,
    wherein the electronic device comprises a resistance, an inductance, capacitance, or a rectifying device, and
    wherein the material of the resistance comprises tantalum nitride (TaN), silicon-chromium alloy (SiCr), or nickel-chromium alloy (NiCr).

2. The method of fabricating the light-emitting device of claim 1, wherein the rectifying device comprises a plurality of second semiconductor stacks.

3. The method of fabricating the light-emitting device of claim 1, wherein the second major surface of the single growth substrate is devoid of light-emitting stack formed thereon.

4. The method of fabricating the light-emitting device of claim 2, wherein the second semiconductor stacks comprise a light-emitting diode, a Zener diode, or a Schottky diode.

5. The method of fabricating the light-emitting device of claim 1, further comprising covering a wavelength converting layer on the first light-emitting stacks, wherein the material of the wavelength converting layer comprises a fluorescent material or a phosphor material.

6. A method of fabricating a light-emitting device, comprising:
    providing a single growth substrate, comprising a first major surface and a second major surface;
    forming a plurality of first light-emitting stacks on the first major surface of the single growth substrate, wherein the first light-emitting stacks are electrically connected to each other via a first electrical connecting structure;
    forming an electronic device on the second major surface of the single growth substrate;
    forming a second electrical connecting structure extending from the first major surface to the second major surface of the single growth substrate and electrically connecting the first light-emitting stacks and the electronic device; and
    forming a heat dissipation layer on the second major surface of the single growth substrate, wherein the heat dissipation layer comprises a thermal conductivity larger than 50 W/mK.

7. The method of fabricating the light-emitting device of claim 6, wherein the thickness of the heat dissipation layer is larger than 3 μm or the area of the heat dissipation layer is not smaller than 50% of that of the single growth substrate.

8. The method of fabricating the light-emitting device of claim 6, wherein the material of the heat dissipation layer comprises copper, silver, gold, nickel, diamond, diamond-like carbon (DLC), aluminum nitride (AlN), graphite, carbon nanotube (CNT), or the composite thereof.

9. The method of fabricating the light-emitting device of claim 1, wherein the single growth substrate is a single layer structure.

10. The method of fabricating the light-emitting device of claim 1, wherein the plurality of first light-emitting stacks are deposited on the first major surface of the single growth substrate by metal-organic chemical vapor deposition.

11. The method of fabricating the light-emitting device of claim 1, wherein the electronic device is deposited on the second major surface of the single growth substrate by metal-organic chemical vapor deposition.

12. The method of fabricating the light-emitting device of claim 1, further comprising forming a bump pad on the single growth substrate used for electrically connecting the light-emitting stacks and the electronic device with an external power source.

13. A method of fabricating a light-emitting device, comprising:
  providing a single growth substrate, comprising a first major surface and a second major surface;
  forming a plurality of light-emitting stacks on the first major surface of the single growth substrate; and
  forming a bridge rectifying device and a passive device on the second major surface of the single growth substrate, wherein the light-emitting stacks, the bridge rectifying device, and the passive device are electrically connected to each other.

14. The method of fabricating the light-emitting device of claim 13, wherein the passive device comprises a thin-film resistance, a thin-film inductance, or a thin-film capacitance.

15. The method of fabricating the light-emitting device of claim 13, wherein the single growth substrate is a single layer structure.

16. The method of fabricating the light-emitting device of claim 13, wherein the plurality of light-emitting stacks are deposited on the first major surface of the single growth substrate by metal-organic chemical vapor deposition.

17. The method of fabricating the light-emitting device of claim 13, wherein the passive device is deposited on the second major surface of the single growth substrate by metal-organic chemical vapor deposition.

18. The method of fabricating the light-emitting device of claim 13, wherein the second major surface of the single growth substrate is devoid of light-emitting stack formed thereon.

19. The method of fabricating the light-emitting device of claim 6, wherein the single growth substrate is a single layer structure.

20. The method of fabricating the light-emitting device of claim 6, wherein the plurality of first light-emitting stacks are deposited on the first major surface of the single growth substrate by metal-organic chemical vapor deposition.

* * * * *